United States Patent
Daudin et al.

(10) Patent No.: US 12,328,976 B2
(45) Date of Patent: Jun. 10, 2025

(54) LIGHT-EMITTING DIODE COMPRISING A HYBRID STRUCTURE FORMED OF LAYERS AND NANOWIRE

(71) Applicants: COMMISSARIAT A L'ENERGIE ATOMIQUE ET AUX ENERGIES ALTERNATIVES, Paris (FR); CENTRE NATIONAL DE LA RECHERCHE SCIENTIFIQUE, Paris (FR); UNIVERSITE GRENOBLE ALPES, Saint Martin-d'Heres (FR)

(72) Inventors: Bruno Daudin, Grenoble (FR); Gwenole Jacopin, Grenoble (FR); Julien Pernot, Grenoble (FR)

(73) Assignees: COMMISARIAT A L'ENERGIE ATOMIQUE AUX ENERGIES ALTERNATIVES, Paris (FR); CENTRE NATIONAL DE LA RECHERCHE SCIENTIFIQUE, Paris (FR); UNIVERSITE GRENOBLE ALPES, Saint Martin-d'heres (FR)

( * ) Notice: Subject to any disclaimer, the term of this patent is extended or adjusted under 35 U.S.C. 154(b) by 457 days.

(21) Appl. No.: 17/996,284

(22) PCT Filed: Apr. 9, 2021

(86) PCT No.: PCT/FR2021/050630
§ 371 (c)(1),
(2) Date: Oct. 14, 2022

(87) PCT Pub. No.: WO2021/209702
PCT Pub. Date: Oct. 21, 2021

(65) Prior Publication Data
US 2023/0215978 A1    Jul. 6, 2023

(30) Foreign Application Priority Data
Apr. 15, 2020 (FR) .......................... 2003746

(51) Int. Cl.
*H01L 33/32* (2010.01)
*H10H 20/01* (2025.01)
(Continued)

(52) U.S. Cl.
CPC .... *H10H 20/8252* (2025.01); *H10H 20/0137* (2025.01); *H10H 20/812* (2025.01); *H10H 20/8215* (2025.01)

(58) Field of Classification Search
None
See application file for complete search history.

(56) References Cited

U.S. PATENT DOCUMENTS 10,553,751 B2 *  2/2020  Mi .................. H10H 20/818
2010/0264400 A1  10/2010  Kim
(Continued)

FOREIGN PATENT DOCUMENTS

CN   108616797 A   10/2018
EP   2 242 120 A1  10/2010
(Continued)

OTHER PUBLICATIONS

International Search Report & Written Opinion issued Jun. 18, 2021 in PCT/FR2021/050630 filed on Apr. 9, 2021, 17 pages.
(Continued)

*Primary Examiner* — William C Trapanese
(74) *Attorney, Agent, or Firm* — Oblon, McClelland, Maier & Neustadt, L.L.P.

(57) ABSTRACT

A light-emitting diode is provided, including: a first layer of n-doped $Al_{X1}Ga_{(1-X1-Y1)}In_{Y1}N$, with X1>0 and X1+Y1≤1; a second layer of p-doped $Al_{X2}Ga_{(1-X2-Y2)}In_{Y2}N$, with X2>0 and X2+Y2≤1; an active area disposed between the first and the second layers and comprising at least one multi-quantum well emissive structure; nanowires based on AlN p-doped with indium and magnesium atoms, disposed on the second (Continued)

layer; and an ohmic contact layer in contact with the nanowires. A method for producing a light-emitting diode is also provided.

14 Claims, 5 Drawing Sheets

(51) Int. Cl.
*H10H 20/81* (2025.01)
*H10H 20/812* (2025.01)
*H10H 20/825* (2025.01)

(56) References Cited

U.S. PATENT DOCUMENTS

| | | |
|---|---|---|
| 2011/0140072 A1 | 6/2011 | Varangis et al. |
| 2012/0187442 A1* | 7/2012 | Masaki ............... H10H 20/835 257/E33.072 |
| 2019/0067521 A1 | 2/2019 | Takano et al. |
| 2019/0214523 A1 | 7/2019 | Robin et al. |

FOREIGN PATENT DOCUMENTS

| | | |
|---|---|---|
| EP | 3 413 359 A1 | 12/2018 |
| JP | 2005-228936 A | 8/2005 |
| JP | 2009-505415 A | 2/2009 |
| JP | 2009-542560 A | 12/2009 |
| JP | 2011-249765 A | 12/2011 |
| JP | 2013-004661 A | 1/2013 |
| JP | 2017-139252 A | 8/2017 |
| JP | 2018-002544 A | 1/2018 |
| WO | WO 2017/216445 A1 | 12/2017 |

OTHER PUBLICATIONS

French Preliminary Search Report issued Dec. 2, 2020 in French Application 20 03746 filed on Apr. 15, 2020, 2 pages (with English Translation of Categories of Cited Documents).

Siladie et al., "Mg and In Codoped p-type AlN Nanowires for pn Junction Realization", Nano Letters, vol. 19, No. 12, 2019, 8 pages.

Japanese Office Action dated Feb. 12, 2025, issued in Japanese Application No. 2022-562844 (with English translation; documents 1 and 15-22 being cited therein).

* cited by examiner

LIGHT-EMITTING DIODE COMPRISING A HYBRID STRUCTURE FORMED OF LAYERS AND NANOWIRE

TECHNICAL FIELD

The invention relates to the field of light-emitting diodes, or LEDs ("Light-Emitting Diodes"). Advantageously, the invention applies to the production of LEDs emitting light in the ultraviolet (UV) range, in particular in the range of the wavelengths comprised between about 200 nm and 350 nm.

PRIOR ART

In the field of UV light emission, there is a need to find light emission solutions not using mercury. The LEDs composed of an alloy of AlN and GaN are a solution to this problem.

The LEDs based on semiconductor heterostructures emitting in the UV range consist of a stack of layers comprising AlGaN of different compositions. FIG. 1 schematically shows the structure of such a LED 10. The LED 10 includes a p-n junction formed by a first layer 12 comprising n-doped AlGaN and a second layer 14 comprising p-doped AlGaN. The LED 10 also includes, between the layers 12 and 14, an active area 16 forming the emissive region of the LED 10 and comprising quantum wells in which the recombinations of electrons and electron holes take place which generate the emission of photons. The active area 16 comprises not intentionally doped, or intrinsic, AlGaN. The LED 10 also includes, on the second layer 14, a layer 18 of heavily p-doped GaN, as well as an electrically conductive layer 20 disposed on the layer 18 and including for example an Ni—Au alloy. These layers are formed by MOCVD ("Metal Organic Chemical Vapour Deposition", or chemical vapour deposition from metal-organic precursors).

The composition of the semiconductor of the active area 16 is selected depending on the wavelengths intended to be emitted by the LED 10. In order to emit in the UV range, the active area 16 includes $Al_X Ga_{(1-X)}N$, with X such that $0 \leq X \leq 1$. The first layer 12 includes n-doped $Al_{Y1} Ga_{(1-Y1)}N$, and the second layer 14 includes p-doped $Al_{Y2} Ga_{(1-Y2)}N$, with $Y_1 > X$ and $Y_2 > X$.

Ideally, making the layers 12 and 14 with AlN (that is to say made such that $Y_1 = 1$ and $Y_2 = 1$) would allow simplifying the making of the LED 10. However, making the second layer 14 p-doped with AlN poses a problem because there is no technical solution allowing obtaining AlN with a p-type doping level which is large enough to ensure an electrical conduction which is sufficient and necessary for the proper operation of the LED 10. The layers 12 and 14 are therefore currently made such that $Y_1 < 1$ and $Y_2 < 1$.

In addition, in order to reach significant wavelengths in the UV range, for example in the range of 300 nm or less, the layers 12 and 14 must include a high concentration of aluminium (for example greater than about 60%), which poses a problem for carrying out the p-doping of the layer 14.

Finally, the injection of current which must be carried out on the side of the layer 14 of the LED 10 is another significant constraint to be considered.

These problems are currently solved thanks to the presence of the layer 18 of heavily p-doped GaN whose thickness is a few tens of nanometres and which allows ensuring the transition between the layers 14 and 20. But the absorption of the UV radiation (in particular for the wavelengths less than about 350 nm) emitted from the active area 16 by this layer 18 limits the effectiveness of the LED 10. In particular, the LEDs emitting wavelengths comprised between about 250 nm and 260 nm and used for bactericidal applications see their effectiveness intrinsically reduced by the absorption of a portion of the radiation emitted by the layer 18 of heavily p-doped GaN.

In addition, the deposition of layer 20, necessary to ensure a good lateral distribution of the current lines and to optimise the current injection on the side of the layer 14 of the LED 10, contributes to further degrading the emission efficiency of the LED 10 because this layer 20 absorbs a portion of the UV light emitted from the active area 16.

The document "Mg and In Codoped p-type AlN Nanowires for pn Junction Realization" by A-M Siladie et al., Nano Letters 2019 19 (12), 8357-8364, proposes the realisation of a p-n junction including AlN nanowires in which it is possible to carry out a significant p-doping thanks to the use of magnesium atoms. Such nanowires are produced by growth on a silicon substrate. These nanowires also include, in the upper portion thereof, p-doped GaN. The nanowires are covered with an ITO (indium tin oxide) layer deposited on top of the p-doped GaN portions of the nanowires and used as an ohmic contact. If such a p-n junction was used to produce a UV LED which would then be made of nanowires, this LED produced with an ITO ohmic contact layer would not be optimal because ITO could be found between the nanowires, which can create short circuits between the n and p-doped portions of the nanowires.

DISCLOSURE OF THE INVENTION

An aim of the present invention is to provide a light-emitting diode whose structure avoids the creation of short circuits due to the ohmic contact layer formed at the top of the LED.

For this, the present invention proposes a light-emitting diode including at least:
- a first n-doped $Al_{X1} Ga_{(1-X1-Y1)} In_{Y1} N$ layer, with $X1 > 0$ and $X1 + Y1 \leq 1$;
- a second p-doped $Al_{X2} Ga_{(1-X2-Y2)} In_{Y2} N$ layer, with $X2 > 0$ and $X2 + Y2 \leq 1$;
- an active area disposed between the first and second layers and comprising at least one multi-quantum well emissive structure;
- nanowires based on AlN p-doped with indium and magnesium atoms, disposed on the second layer;
- an ohmic contact layer in contact with the nanowires.

Such a LED therefore includes a hybrid structure formed of a stack of layers and p-doped AlN-based nanowires disposed on this stack of layers. With such a structure, the short circuits due to the ohmic contact layer formed at the top of the LED are avoided because the material of this ohmic contact layer cannot be in contact with both the nanowires and the material of the first layer thanks to the presence of the second layer.

Another advantage offered by the present invention is the production of light-emitting diodes (or LEDs) whose hybrid structure can improve the extraction of the photons thanks to the production of an organised array of nanowires.

Furthermore, the nanowires based on AlN p-doped with indium and magnesium atoms, disposed on the second layer, allow ensuring a good lateral distribution of the current lines and optimising the injection of current on the side of the p-doped layer of the LED, while limiting the light absorption on this side of the LED.

The multi-quantum well structure of the active area may correspond to one or more layers of quantum dots each formed of an emissive layer disposed between two barrier layers.

Throughout the text, the expression "nanowire based on AlN" designates a nanowire which may include, in addition to AlN, a mole fraction of at least one other material comprised between 0 and 30%. This or these other materials correspond for example to GaN, InN or BN. When this other material corresponds to InN, the mole fraction of InN present in the AlN-based nanowires is preferably less than or equal to 20%. Advantageously, the mole fraction of the material(s), regardless of this or these materials, present in the AlN-based nanowires is preferably less than or equal to 5%. The expression "AlN-based nanowire" also covers the case of AlN nanowires, that is to say nanowires including no material other than AlN.

In a first embodiment, the LED may further include a dielectric layer covering lateral flanks of the nanowires and on which the ohmic contact layer rests.

In a second embodiment, the ohmic contact layer may cover lateral flanks of the nanowires and/or tops of the nanowires. When the ohmic contact layer covers the lateral flanks of the nanowires, the nanowires may be disposed in the ohmic contact layer. This configuration is advantageous because the contact surface between the ohmic contact layer and the nanowires is more significant, which improves the lateral distribution of the current lines and the current injection on the side of the p-doped layer of the LED.

Advantageously, the ohmic contact layer may include diamond.

The atomic concentration of indium in the nanowires may be comprised between about $10^{17}$ and $10^{21}$ atoms/cm$^3$ and/or the atomic concentration of magnesium in the nanowires may be comprised between about $10^{18}$ and $10^{21}$ atoms/cm$^3$.

At least one portion of the thickness of the second layer may be etched and may form pillars on which the nanowires may be disposed.

The multi-quantum well emissive structure may include $Al_{X3}Ga_{(1-X3)}N$, with X3 comprised between about 0 and 1, or between 0 and 0.9. When X3=1, the structure of the LED corresponds to that of a p-n junction which may be advantageous to carry out a light emission at a wavelength equal to 200 nm.

The light-emitting diode may further include a third layer of not intentionally doped $Al_{X4}Ga_{(1-X4-Y4)}In_{Y4}N$, with X4>0 and X4+Y4≤1, such that the first layer is disposed between the active area and the third layer.

The lateral dimensions of the nanowires at the interface with the second layer may be smaller than those at the interface with the ohmic contact layer.

The nanowires may each have a cylindrical shape or, alternatively, another shape such as for example a frustoconical shape. Nanowires of frustoconical shape with a section of larger dimensions at the top may allow promoting the deposition of the ohmic contact layer.

The invention also relates to a method for producing a light-emitting diode, including at least:
producing a first layer of n-doped $Al_{X1}Ga_{(1-X1-Y1)}In_{Y1}N$, with X1>0 and X1+Y1≤1;
producing an active area disposed on the first layer and comprising at least one multi-quantum well emissive structure;
producing a second layer of p-doped $Al_{X2}Ga_{(1-X2-Y2)}In_{Y2}N$, with X2>0 and X2+Y2≤1, on the active area;
producing nanowires based on AlN p-doped with indium and magnesium atoms, on the second layer;
producing an ohmic contact layer disposed in contact with the nanowires.

The first layer, the active area and the second layer may be produced by MOCVD type depositions, and the nanowires may be produced by molecular beam epitaxy.

The ohmic contact layer may be produced, for example, by molecular beam epitaxy, by vacuum evaporation, by cathode sputtering, by chemical vapour deposition (CVD).

According to one particular configuration, the production of the nanowires may include the implementation of the following steps:
producing, on the second layer, a hard mask through which openings, whose number and arrangement correspond to the number and arrangement of the nanowires which are intended to be produced, pass;
producing the nanowires by epitaxy from the openings of the hard mask, on the face of the second layer on which the hard mask is disposed.

According to another particular configuration, the production of the nanowires may include the implementation of the following steps:
etching implemented in at least one portion of the thickness of the second layer and from a face of the second layer on the side of which the nanowires are intended to be produced, forming pillars whose number and arrangement correspond to the number and arrangement of the nanowires which are intended to be produced;
producing the nanowires by epitaxy on the pillars which are formed in the second layer.

BRIEF DESCRIPTION OF DRAWINGS

The present invention will be better understood on reading the description of exemplary embodiments given for illustrative purposes only and without limitation, with reference to the appended drawings in which.

Identical, similar or equivalent portions of the different figures described below bear the same numerical references so as to facilitate passage from one figure to another.

The different portions shown the figures are not necessarily drawn on a uniform scale, to make the figures more readable.

The different possibilities (variants and embodiments) must be understood as not being mutually exclusive and can be combined with each other.

DETAILED DISCLOSURE OF PARTICULAR EMBODIMENTS

Figure 1:
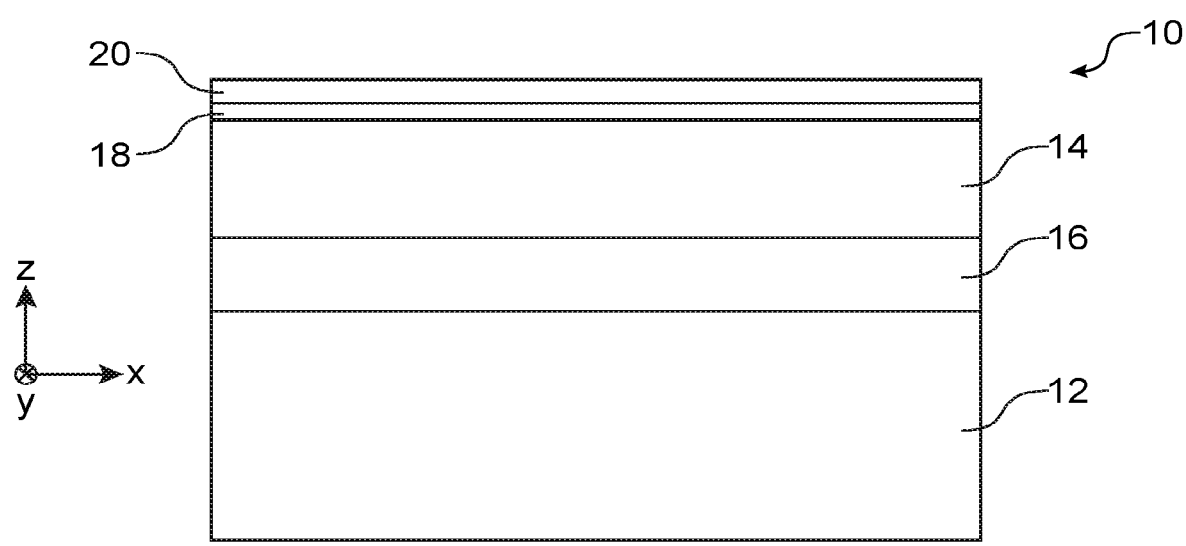
FIG. 1 shows a LED of the prior art and emitting in the UV range.
Figure 2:
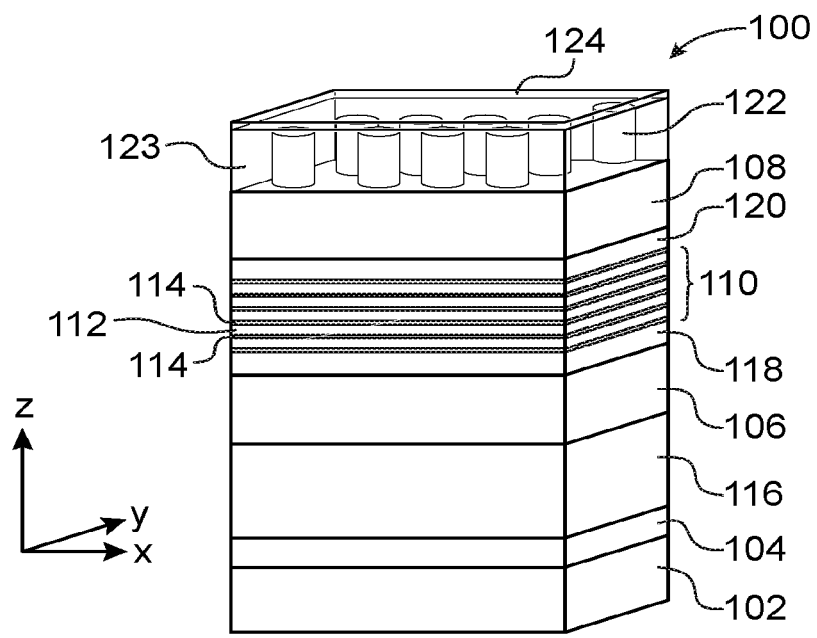
FIGS. 2 to 5 show hybrid structure LEDs including layers of materials and nanowires, objects of the present invention, according to different embodiments.

FIG. 2, described below, shows a hybrid structure LED 100 formed from layers of materials and nanowires, according to a first embodiment.

In the description below, the term "thickness" is used to designate the dimension parallel to the Z-axis, that is to say the dimension parallel to the stacking direction of the different layers of the LED 100.

The LED 100 includes a substrate 102. In this first embodiment, the substrate 102 includes for example sapphire. Other types of substrates may be used, comprising for example a semiconductor material such as silicon. The thickness of this substrate 102 is for example equal to several hundreds of microns.

The LED 100 also includes a buffer layer 104 disposed on substrate 102. The buffer layer 104 includes AlN. The thickness of the buffer layer 104 is for example comprised between about 0.5 and 3 microns.

The LED 100 includes a first layer 106 of n-doped $Al_{X1}Ga_{(1-X1-Y1)}In_{Y1}N$, with X1>0 and X1+Y1≤1. Preferably, the value of X1 is comprised between about 0.7 and 0.8 and the value of Y1 is comprised between about 0 and 0.1. Advantageously, the value of Y1 is zero, which means that the semiconductor of the first layer 106 is AlGaN. The thickness of the first layer 106 is for example equal to 1 μm, or comprised between about 0.5 μm and 5 μm.

According to an exemplary embodiment, the n-type doping of the semiconductor of the first layer 106 is obtained by incorporating silicon atoms into the semiconductor of the first layer 106 during the deposition of this semiconductor. The concentration of dopants in the semiconductor of the first layer 106 is for example between $10^{17}$ at/$cm^3$ and $10^{19}$ at/$cm^3$.

LED 100 also includes a second layer 108 of p-doped semiconductor. The semiconductor of the second layer 108 corresponds to p-doped $Al_{X2}Ga_{(1-X2-Y2)}In_{Y2}N$, with X2>0 and X2+Y2≤1. Advantageously, the semiconductor of the second layer 108 is such that X2=X1 and Y2=0. It is also possible and advantageous to have X2=1. The concentration of dopants in the semiconductor of the second layer 108 is for example comprised between about $10^{18}$ at/$cm^3$ and $10^{21}$ at/$cm^3$. The thickness of the second layer 108 is for example equal to 1 μm, and more generally comprised between about 0.2 μm and 1 μm.

The LED 100 also includes an active area 110 disposed between the first layer 106 and the second layer 108. This active area 110 includes a multi-quantum well emissive structure from which light is intended to be emitted. This emissive structure includes one or more emissive layers 112 each disposed between two barrier layers 114.

The emissive layers 112 include a semiconductor corresponding for example to $Al_{X3}Ga_{(1-X3)}N$, with X3 such that X3<X2 and X1 and X3 preferably comprised between 0 and 0.9. This semiconductor is not intentionally doped (or intrinsic), that is to say is not subjected, during the production of the LED 100, to a step introducing doping atoms into the semiconductor. The concentration of the residual doping atoms present in this semiconductor is for example comprised between about $10^{15}$ and $10^{17}$ atoms/$cm^3$. The thickness of each of the emissive layers 112 is for example comprised between about 1 and 10 nm.

Advantageously, the value of X3 is selected such that the wavelength of the light emitted from the emissive layers 112 of the active area 110 belongs to the UV range, in particular between about 210 nm and 340 nm, and more particularly UV-C (that is to say between 210 nm and 280 nm), which corresponds to X3 such that 0.7<X3<1. It is also possible that X3 is comprised between 0 and 1 and when X3=1, the structure of the LED is advantageous for carrying out a light emission at a wavelength equal to 200 nm.

The barrier layers 114 also include a semiconductor corresponding for example to AlN or $Al_xGa_{1-x}N$ with X>X3 and preferably equal to X3+0.1. As the semiconductor of the emissive layers 112, the semiconductor of the barrier layers 114 is not intentionally doped. The thickness of each of the barrier layers 114 is for example comprised between about 1 nm and 10 nm.

The thickness of the active area 110 is for example equal to 100 nm, and more generally comprised between about 100 nm and 300 nm.

In the exemplary embodiment which corresponds to the LED 100 visible in FIG. 2, the LED 100 also includes a third layer 116 such that the first layer 106 is disposed between the active area 110 and the third layer 116. This third layer 116 includes for example $Al_{X4}Ga_{(1-X4-Y4)}In_{Y4}N$ not intentionally doped, with X4>0 and X4+Y4≤1. Preferably, the value of X4 is comprised between about 0.3 and 0.7 and the value of Y4 is comprised between about 0 and 0.1. It is also possible for the composition of the third layer 116 to be identical to that of the first layer 106, or for X4 to be for example equal to X1—0.1. The thickness of the third layer 116 is for example comprised between about 500 nm and 2 microns. The concentration of residual dopants present in the third layer 116 is for example comprised between about $5·10^{15}$ and $5·10^{16}$ dopants/$cm^3$.

Alternatively, it is possible that the LED 100 does not include the third layer 116.

In the particular exemplary embodiment shown in FIG. 2, the LED 100 also includes a layer 118 of not intentionally doped AlGaN disposed between the first layer 106 and the active area 110, and whose thickness is for example equal to 20 nm or comprised between about 10 nm and 30 nm, as well as a layer 120 of not intentionally doped AlGaN disposed between the second layer 108 and the active area 110, and whose thickness is for example equal to 20 nm or comprised between about 10 nm and 30 nm, and used as an electron blocking layer to avoid an excess of electrons in the second layer 108 and promote the recombination of charge carriers in the active area 110. Alternatively, the LED 100 may not include the layer 118.

The LED 100 also includes p-doped AlN-based nanowires 122 made on the second layer 108. The geometric characteristics of these nanowires 122 are for example a diameter comprised between 50 nm and 100 nm, a density in the range of $10^{10}$ per $cm^2$, a spacing between the centres of the wires comprised between 100 nm and 200 nm, a height comprised for example between 100 nm and 1 micron.

In order for the p-doping level in the 122 nanowires to be significant, that is to say greater than about $10^{20}$ atoms/$cm^3$, the material of the 122 nanowires is doped with indium and magnesium atoms. The atomic concentration of indium in the nanowires 122 is for example comprised between about $10^{17}$ and $10^{21}$ atoms/$cm^3$, and the atomic concentration of magnesium in the nanowires 122 is for example between about $10^{18}$ and $10^{21}$ atoms/$cm^3$. Other characteristics of such doping applicable to the LED 100 described herein are described in the document "Mg and In Codoped p-type AlN Nanowires for pn Junction Realization" by A-M Siladie et al., Nano Letters 2019 19 (12), 8357-8364.

The LED 100 also includes a dielectric layer 123 formed around the nanowires 122, comprising for example $SiO_2$. The dielectric layer 123 does not cover the tops of the nanowires 122 so that the nanowires 122 are electrically accessible from their top.

Finally, the LED 100 includes an ohmic contact layer 124 disposed on the tops of the nanowires 122 and electrically connected to these nanowires 122. This ohmic contact layer 124 includes at least one material which is electrically conductive and transparent to the wavelengths intended to be emitted by the LED 100, such as for example ITO or advantageously diamond.

Figure 3:
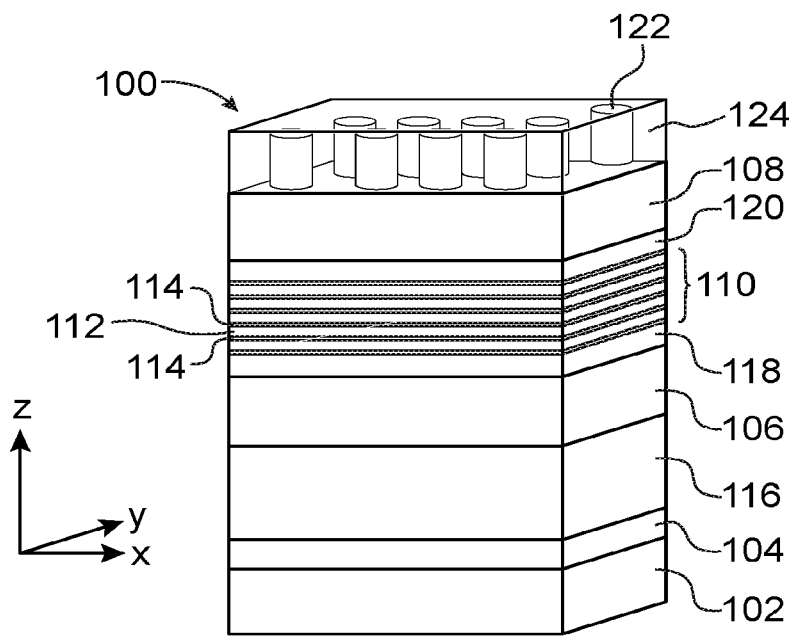

FIG. 3 which is described below shows a hybrid structure LED 100 including layers of materials and nanowires, according to a second embodiment.

Relative to the LED 100 according to the first previously described embodiment, the LED 100 according to this second embodiment includes an ohmic contact layer 124 which covers the tops of the nanowires 122 and which is also deposited between the nanowires 122, on the second layer 108, by covering the lateral flanks of the nanowires 122. Such an ohmic contact layer 124 is for example obtained by depositing the material of this layer perpendicular to the surface of the second layer 108 on which the nanowires 122 are disposed. Such an ohmic contact layer 124 is advantageous because the contact surface between it and the nanowires 122 is larger than in the first embodiment. In this second embodiment, the LED 100 does not include the dielectric layer 123.

Figure 4:
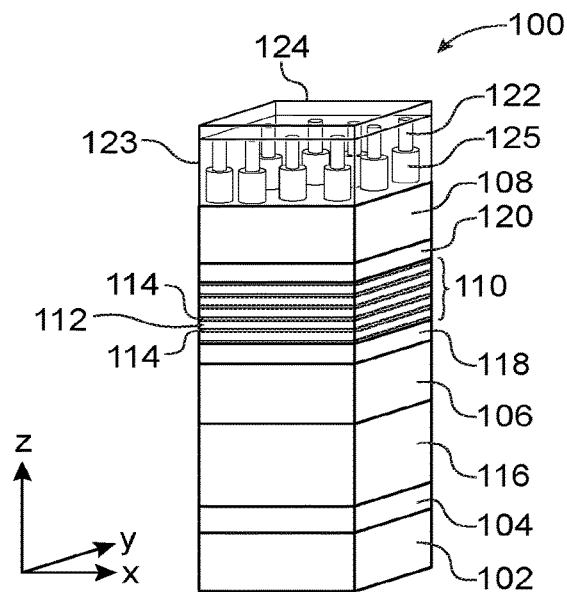

FIG. 4 which is described below shows a hybrid structure LED 100 including layers of materials and nanowires, according to a third embodiment.

Relative to the LEDs 100 according to the first and second previously described embodiments, the second layer 108 of the LED 100 according to this third embodiment is etched over a portion of its thickness, from the face of the second layer 108 on the side of which the nanowires 122 are intended to be produced. Pillars 125, or columns, whose number and arrangement correspond to the number and arrangement of the produced nanowires 122, are formed in the etched portion of the second layer 108. In the example of FIG. 4, the pillars 125 each have a section, in a plane parallel to the face of the second layer 108 from which the pillars 125 are etched (plane parallel to the plane (X, Y)), of circular or oval shape. Alternatively, these sections of the pillars 125 may be of different shape, for example polygonal. In the case of pillars 125 of circular section, the diameter of the section of each pillar 125 is for example comprised between about 50 nm and 100 nm. In the case of pillars 125 of polygonal section, the largest diagonal of the section of each pillar 125 is for example comprised between about 50 nm and 100 nm. The height of each pillar 125 (dimension along the Z-axis, and which corresponds to the stacking direction of the different layers of the LED 100) is for example comprised between about 300 nm and 500 nm.

The nanowires 122 are produced on the pillars 125. The dielectric layer 123 is formed around the nanowires 122 and the pillars 125, and does not cover the tops of the nanowires 122. The ohmic contact layer 124 is disposed on the tops of the nanowires 122 and is electrically connected to these nanowires 122, and also rests on the portions of the dielectric layer 123 located between the nanowires 122.

Figure 5:
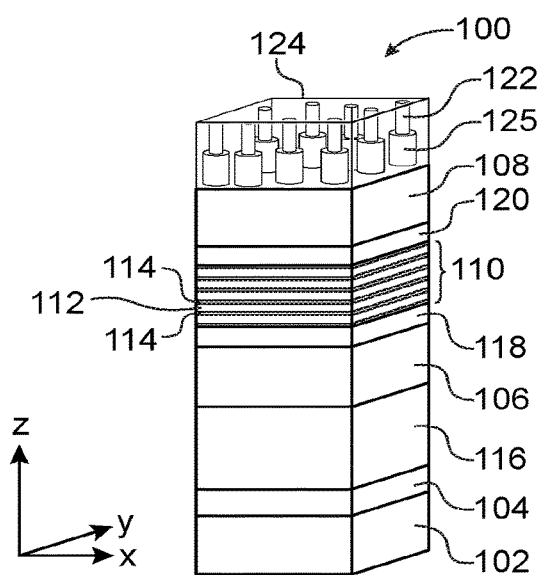

FIG. 5 described below shows a hybrid structure LED 100 including layers of materials and nanowires, according to a fourth embodiment.

As in the third embodiment, the LED 100 according to this fourth embodiment includes the pillars 125 formed in a portion of the thickness of the second layer 108, with the nanowires 122 formed on these pillars 125. In this fourth embodiment, the ohmic contact layer 124 covers the tops of the nanowires 122 and is also deposited between the nanowires 122 and between the pillars 125, on the non-etched portion of the second layer 108, by covering the lateral flanks of the nanowires 122 and of the pillars 125.

Alternatively of this embodiment, the ohmic contact layer 124 may not cover the tops of the nanowires 122. In this case, the ohmic contact layer 124 only covers the lateral flanks of the nanowires 122 and of the pillars 125.

According to another embodiment, the dielectric layer 123 may only cover the lateral flanks of the pillars 125, and the ohmic contact layer 124, in this case, covers the lateral flanks of the nanowires 122 and possibly the tops of the nanowires 122. Variants are possible, as for example by having the dielectric layer 123 which covers the lateral flanks of the pillars 125 only over one portion of the height of the pillars 125 and the ohmic contact layer 124 which covers the lateral flanks of the pillars 125 over the rest of the height of the pillars 125 and which also covers the lateral flanks of the nanowires 122, or else by having the dielectric layer 123 which covers the lateral flanks of the pillars 125 and the lateral flanks of the nanowires 122 over one portion of the height of the nanowires 122 and the ohmic contact layer 124 which covers the lateral flanks of the nanowires 122 over the rest of the height of the nanowires 122. In all cases, the ohmic contact layer 124 may or may not cover the tops of nanowires 122.

Alternatively of the first, second, third and fourth previously described embodiments, the lateral dimensions of the nanowires 122 at the interface with the second layer 108 may be smaller than those at the interface with the ohmic contact layer 124. In this variant, the nanowires 122 have a substantially truncated conical shape such that the surface of the nanowires 122 in contact with the second layer 108 is less than the surface of the nanowires 122 at the top thereof.

A first method for producing the LED 100 is described below in connection with FIGS. 6 to 9.

Figure 6:
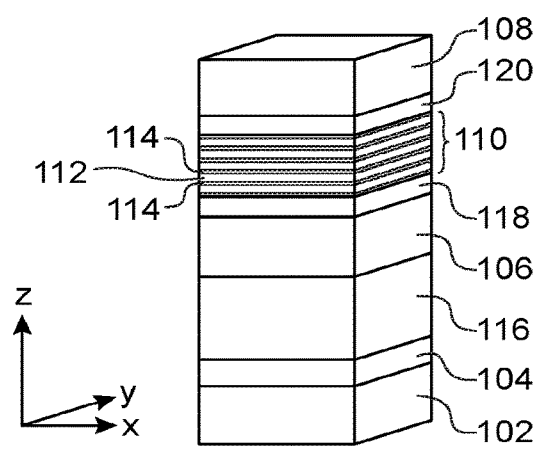
FIGS. 6 to 9 show the steps of a first method of producing a hybrid structure LED including layers of materials and nanowires, object of the present invention.

As shown in FIG. 6, the different layers of the LED 100 are produced, from the substrate 102, by successive depositions, these depositions being advantageously of the MOCVD type. During such MOCVD deposition, the constituent elements used for depositing the semiconductor are organometallic precursors, for example trimethylaluminium or triethylaluminium used as a source of aluminium, ammonia used as a source of nitrogen, trimethylindium or triethylindium used as a source of indium, and optionally trimethylgallium or triethylgallium used as a source of gallium.

Figure 7:
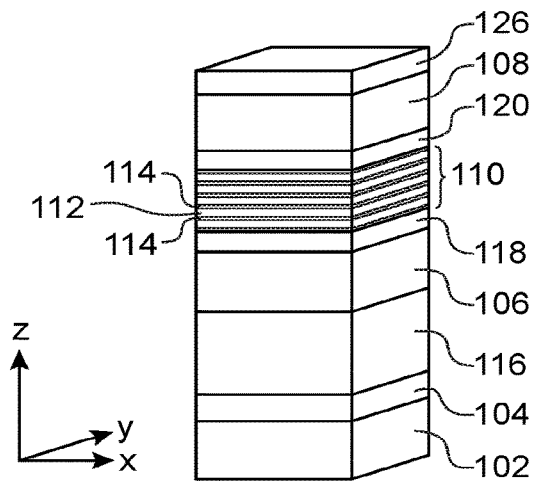

After producing the second layer 108, a layer 126 from which a hard mask is intended to be produced, is deposited on the second layer 108 (see FIG. 7). This layer 126 comprises for example SiN or graphene or TiN.

Figure 8:
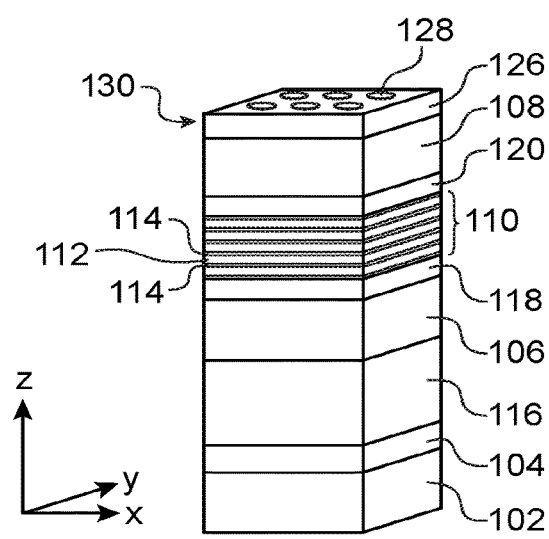

Lithography and etching steps are then implemented to form, through the layer 126, openings 128 whose number and arrangement correspond to the number and arrangement of the nanowires 122 intended to be produced, thus forming a hard mask 130 which will be used for the growth of the nanowires 122 (see FIG. 8).

Figure 9:
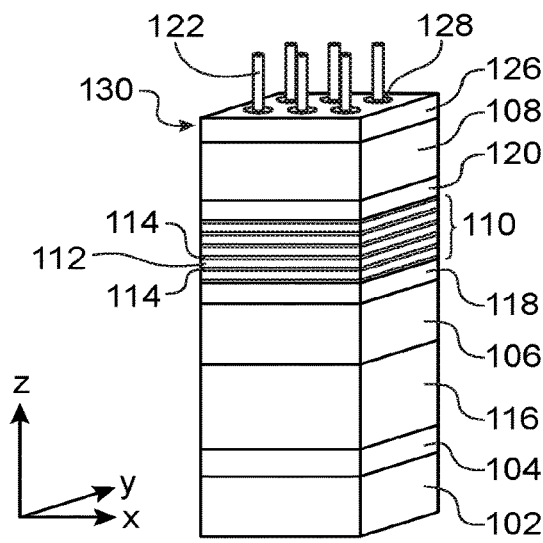

An epitaxy, advantageously by molecular beam, is implemented from the openings 128 of the hard mask 130 in order to form the nanowires 122 (FIG. 9). The doping of the material of the nanowires 122 by indium and magnesium atoms is implemented simultaneously with their growth. Implementation details of such a doping are described in the document "Mg and In Codoped p-type AlN Nanowires for pn Junction Realization" by A-M Siladie et al., Nano Letters 2019 19 (12), 8357-8364.

The LED 100 is completed either by first producing the dielectric layer 123 then the ohmic contact layer 124 as previously described for the first embodiment (see FIG. 2), or by producing the ohmic contact layer 124 as previously described for the second embodiment (see FIG. 3). In both cases, the hard mask 130 may be kept or removed before the production of the dielectric layer 123 or the ohmic contact layer 124. The hard mask 130 is preferably removed to avoid the absorption of the UV light emitted by the LED 100.

The dielectric layer 123 is for example produced by spin coating. The ohmic contact layer 124 is for example produced by molecular beam epitaxy, or by vacuum evaporation, or by cathode sputtering, or by chemical vapour deposition.

A second method for producing the LED 100 is described below in connection with FIGS. 10 to 14.

Figure 10:
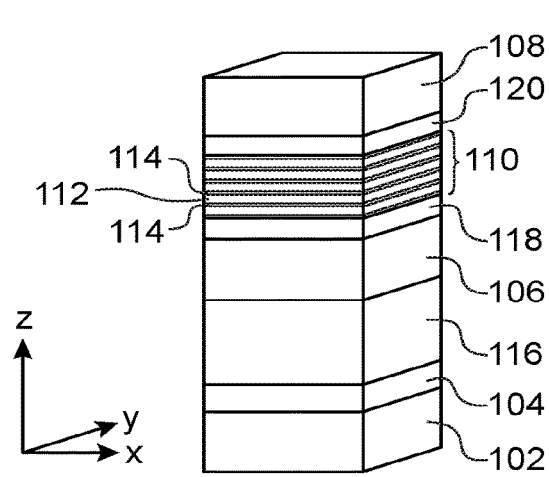
FIGS. 10 to 14 show the steps of a second method for producing a hybrid structure LED including layers of materials and nanowires, which is the subject of the present invention.
Figure 11:
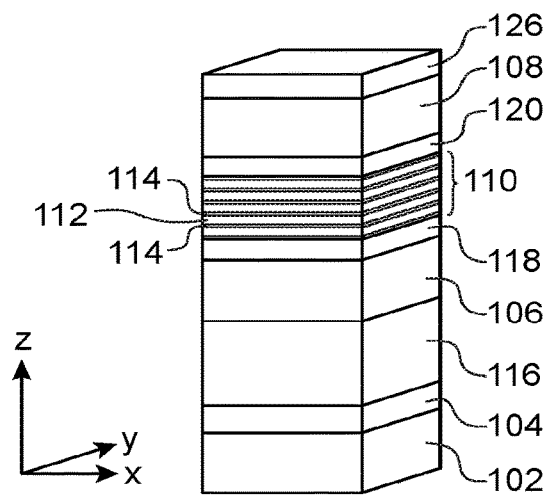
Figure 12:
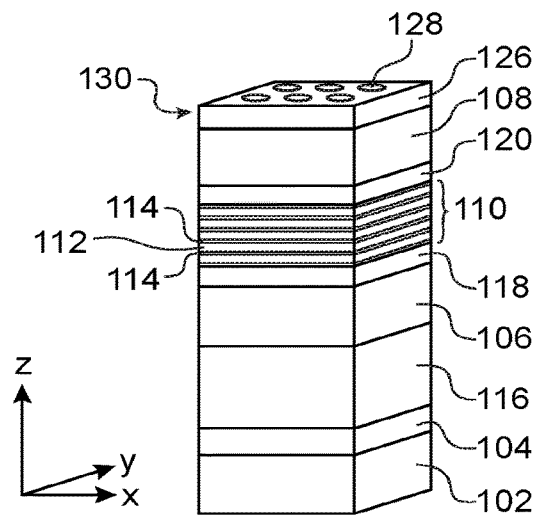
Figure 13:
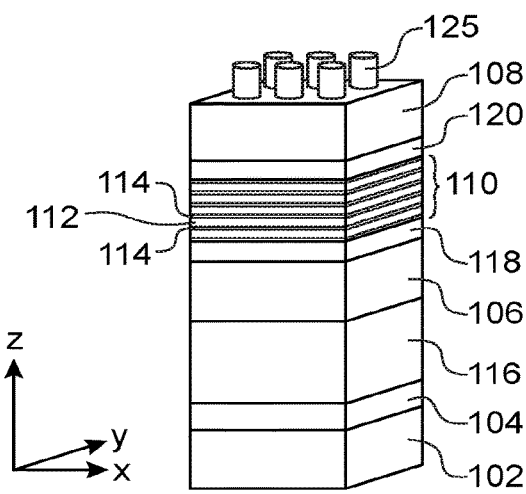

The steps of the first method for producing the LED 100 which are previously described in connection with FIGS. 6 to 8 are first of all implemented. These steps are shown in FIGS. 10 through 12.

The hard mask 130 is then used to etch, in a portion of the thickness of the second layer 108 and from the face of the second layer 108 on the side of which the nanowires 122 are intended to be produced (which corresponds to the face of the second layer 108 on which the hard mask 130 is made), the pillars 125 whose number and arrangement correspond to the number and arrangement of the openings 128. The hard mask 130 is then removed (see FIG. 13).

Figure 14:
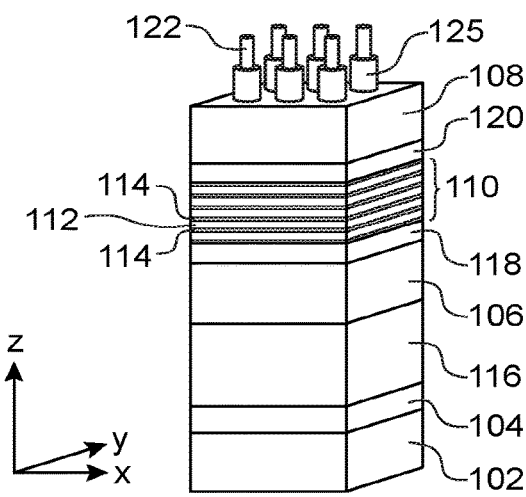

An epitaxy, advantageously by molecular beam, is implemented to grow the nanowires 122 on the tops of pillars 125 (FIG. 14). The doping of the material of the nanowires 122 with indium and magnesium atoms is implemented simultaneously with their growth, analogously to what is previously described in the first method of production.

The LED 100 is completed either by first producing the dielectric layer 123 then the ohmic contact layer 124 as previously described for the third embodiment (see FIG. 4), or by producing the ohmic contact layer 124 as previously described. for the fourth embodiment (see FIG. 5).

Furthermore, for the different production methods described above, the nanowires 122 may be produced such that the lateral dimensions at the interface with the second layer 108 are smaller than those at the top thereof. Implementation details to form such nanowires are described in the document "Mg and In Codoped p-type AlN Nanowires for pn Junction Realization" by A-M Siladie et al., Nano Letters 2019 19 (12), 8357-8364.

In the production methods described above, the nanowires 122 are produced in equipment different from that used to produce the other layers of the LED 100. In order to facilitate the passage from one equipment to another, for example for the passage from MOCVD deposition equipment used to produce the layers of the LED 100 to MBE epitaxy equipment used to produce the nanowires 122, it is possible to deposit on the structure produced by MOCVD deposition, before removing it from the MOCVD deposition equipment, a protective layer for example based on GaN. Once the structure is in the MBE epitaxy equipment, the protective layer is removed and the nanowires 122 are produced.

The invention claimed is:

1. A light-emitting diode, comprising:
a first layer of n-doped $Al_{X1}Ga_{(1-X1-Y1)}In_{Y1}N$, with $X1>0$ and $X1+Y1\leq1$;
a second layer of p-doped $Al_{X2}Ga_{(1-X2-Y2)}In_{Y2}N$, with $X2>0$ and $X2+Y2\leq1$;
an active area disposed between the first and the second layers and comprising at least one multi-quantum well emissive structure;
nanowires based on AlN p-doped with indium and magnesium atoms, disposed on the second layer; and
an ohmic contact layer in contact with the nanowires.

2. The light-emitting diode according to claim 1, further comprising a dielectric layer covering lateral flanks of the nanowires and on which the ohmic contact layer rests.

3. The light-emitting diode according to claim 1, wherein the ohmic contact layer covers lateral flanks of the nanowires and/or tops of the nanowires.

4. The light-emitting diode according to claim 1, wherein the ohmic contact layer includes diamond.

5. The light-emitting diode according to claim 1,
wherein an atomic concentration of indium in the nanowires is comprised between about $10^{17}$ atoms/cm$^3$ and $10^{21}$ atoms/cm$^3$, and/or
wherein an atomic concentration of magnesium in the nanowires is comprised between about $10^{18}$ atoms/cm$^3$ and $10^{21}$ atoms/cm$^3$.

6. The light-emitting diode according to claim 1, wherein at least one portion of a thickness of the second layer is etched and forms pillars on which the nanowires are disposed.

7. The light-emitting diode according to claim 1, wherein the at least one multi-quantum well emissive structure includes $Al_{X3}Ga_{(1-X3)}N$, with X3 comprised between about 0 and 1.

8. The light-emitting diode according to claim 1, further comprising a third layer of not intentionally doped $Al_{X4}Ga_{(1-X4-Y4)}In_{Y4}N$, with $X4>0$ and $X4+Y4\leq1$, such that the first layer is disposed between the active area and the third layer.

9. The light-emitting diode according to claim 1, wherein lateral dimensions of the nanowires at an interface with the second layer are smaller than those at an interface with the ohmic contact layer.

10. A method for producing a light-emitting diode, comprising:
producing a first layer of n-doped $Al_{X1}Ga_{(1-X1-Y1)}In_{Y1}N$, with $X1>0$ and $X1+Y1\leq1$;
producing an active area disposed on the first layer and comprising at least one multi-quantum well emissive structure;
producing a second layer of p-doped $Al_{X2}Ga_{(1-X2-Y2)}In_{Y2}N$, with $X2>0$ and $X2+Y2\leq1$, on the active area;
producing nanowires based on AlN p-doped with indium and magnesium atoms, on the second layer; and
producing an ohmic contact layer disposed in contact with the nanowires.

11. The method according to claim 10,
wherein the first layer, the active area, and the second layer are produced by Metal Organic Chemical Vapour Deposition-type (MOCVD-type) depositions, and
wherein the nanowires are produced by molecular beam epitaxy.

12. The method according to claim 10, wherein the ohmic contact layer is produced by molecular beam epitaxy, or by vacuum evaporation, or by cathode sputtering, or by chemical vapour deposition.

13. The method according to claim 10, wherein the producing the nanowires includes implementation of the following steps:
producing, on the second layer, a hard mask through which openings pass, a number and arrangement of the openings correspond to a number and arrangement of the nanowires that are intended to be produced, and
producing the nanowires by epitaxy from the openings of the hard mask, on the face of the second layer on which the hard mask is disposed.

14. The method according to claim 10, wherein the producing the nanowires includes implementation of the following steps:

etching implemented in at least one portion of a thickness of the second layer and from a face of the second layer on a side of which the nanowires are intended to be produced, forming pillars whose number and arrangement correspond to a number and arrangement of the nanowires which are intended to be produced, and producing the nanowires by epitaxy on the pillars which are formed in the second layer.

\* \* \* \* \*